United States Patent
Lu (10) Patent No.: US 12,317,591 B2
(45) Date of Patent: May 27, 2025

(54) DISPLAY PANEL AND METHOD OF MANUFACTURING THE SAME

(71) Applicant: Shenzhen China Star Optoelectronics Semiconductor Display Technology Co., Ltd., Guangdong (CN)

(72) Inventor: Macai Lu, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 701 days.

(21) Appl. No.: 16/603,439

(22) PCT Filed: May 29, 2019

(86) PCT No.: PCT/CN2019/088920
§ 371 (c)(1),
(2) Date: Dec. 21, 2021

(87) PCT Pub. No.: WO2020/220423
PCT Pub. Date: Nov. 5, 2020

(65) Prior Publication Data
US 2022/0115410 A1    Apr. 14, 2022

(30) Foreign Application Priority Data
Apr. 30, 2019   (CN) .................. 201910361104.8

(51) Int. Cl.
*H10D 86/60*   (2025.01)
*H01L 21/02*   (2006.01)
(Continued)

(52) U.S. Cl.
CPC ....... *H10D 86/60* (2025.01); *H01L 21/02565* (2013.01); *H10D 30/6723* (2025.01);
(Continued)

(58) Field of Classification Search
CPC .............. H01L 27/1225; H01L 27/127; H01L 27/1259; H01L 21/02565; H01L 29/66969;
(Continued)

(56) References Cited

U.S. PATENT DOCUMENTS 7,521,711 B2 *   4/2009   Makimura .......... H01L 27/1285
257/65
8,212,247 B2 *   7/2012   Kang .................. H01L 27/1225
257/43
(Continued)

FOREIGN PATENT DOCUMENTS

CN    104752477 A    7/2015
CN    105206626 A    12/2015
(Continued)

*Primary Examiner* — Herve-Louis Y Assouman
*Assistant Examiner* — Linda J. Fleck
(74) *Attorney, Agent, or Firm* — Taft Stettinius & Hollister LLP (57) ABSTRACT

A display panel and a manufacturing method are provided. The display panel includes a substrate, a source/drain layer, a light shielding layer, a dielectric layer disposed on the substrate and covering the light shielding layer and the source/drain layer, and an oxide semiconductor layer disposed on the dielectric layer. The oxide semiconductor layer is connected to the source/drain layer and the light shielding layer through a first hole and a second hole, respectively. A metal layer is etched to form the source/drain layer and the light shielding layer simultaneously. The dielectric layer arranged on the substrate covers the light shielding layer and the source/drain layer. The dielectric layer functions as an isolating layer, which reduces the number of oxide TFT layers of the display panel, simplifying the film structure of the display panel, reducing the processes and masks required for production, thereby increasing production efficiency and reducing production costs.

15 Claims, 5 Drawing Sheets

(51) Int. Cl.
  *H10D 30/67* (2025.01)
  *H10D 86/01* (2025.01)
  *H10D 86/40* (2025.01)
  *H10D 99/00* (2025.01)

(52) U.S. Cl.
  CPC ..... *H10D 30/6755* (2025.01); *H10D 86/0221* (2025.01); *H10D 86/423* (2025.01); *H10D 99/00* (2025.01)

(58) Field of Classification Search
  CPC .......... H01L 29/78633; H01L 29/7869; H10K 59/1213; H10D 86/60; H10D 86/0221; H10D 86/423; H10D 86/021; H10D 30/6723; H10D 30/6755; H10D 99/00; H10D 10/821; H10F 30/222; H10F 77/937
  See application file for complete search history.

(56) References Cited

U.S. PATENT DOCUMENTS

| | | | |
|---|---|---|---|
| 2015/0187860 A1* | 7/2015 | Seo | H10K 59/126 257/40 |
| 2016/0181344 A1 | 6/2016 | Seo et al. | |
| 2018/0190812 A1 | 7/2018 | Shi | |
| 2019/0013409 A1* | 1/2019 | Li | H01L 29/78645 |
| 2020/0266301 A1* | 8/2020 | Cai | H01L 27/1222 |
| 2020/0312885 A1* | 10/2020 | Imai | H01L 27/127 |

FOREIGN PATENT DOCUMENTS

| | | |
|---|---|---|
| CN | 106531692 A | 3/2017 |
| CN | 106803510 A | 6/2017 |
| CN | 106920801 A | 7/2017 |
| CN | 107170811 A | 9/2017 |
| CN | 108269856 A | 7/2018 |
| CN | 109326609 A | 2/2019 |
| CN | 109585367 A | 4/2019 |
| KR | 20180077954 A | 7/2018 |

* cited by examiner

DISPLAY PANEL AND METHOD OF MANUFACTURING THE SAME

CROSS-REFERENCE TO RELATED APPLICATIONS

This application is a U.S. National Phase of International PCT Application No. PCT/CN2019/088920 filed May 29, 2019, which claims the benefit of Chinese Patent Application Serial No. 201910361104.8 filed Apr. 30, 2019, the contents of each application are incorporated herein by reference in their entirety.

BACKGROUND

1. Field of the Disclosure

The present disclosure relates to the field of manufacturing a display panel, and more particularly, to a display panel and a method of manufacturing the display panel.

2. Description of the Related Art

The display device industry, as an electronic information industry with development potential, has developed rapidly in recent years. The mainstream organic light-emitting diode (OLED) display device industry has become one of the pillar industries in the electronic information industry. A thin film transistor (TFT) is a core device of a flat panel display. A TFT is usually configured as an address switching device in an OLED display device. A hydrogenated amorphous silicon (a-Si:H) TFT is the most widely applied TFT technology, but limited by low carrier mobility. The technology fails to meet the high-definition picture quality requirements of a next-generation OLED display device. The TFT plays a vital role in an OLED display pixel circuit. It not only serves as the address switch, but also provides the drive current for the OLED light-emitting device. This feature makes the OLED have higher requirements on the TFT output current and mobility. At present, the mainstream technology of TFTs which are widely researched for next-generation display devices is a metal oxide TFT typified by indium gallium zinc oxide (IGZO).

A top gate IGZO TFT has higher mobility, smaller parasitic capacitance, and ground leakage current, and is more suitable as a current-driven display circuit. The structure of a TOP Gate IGZO TFT of the related art is complicated, which requires eight or more lithography processes to produce a light shielding layer to the pixel electrode layer. Due to two many masks and production processes required, resulting in high production costs, it is hard to manufacture the TOP Gate IGZO TFT.

In sum, the structure of the oxide film TFT of the related art is complicated with too many manufacturing processes, resulting on high production cost. Therefore, it is necessary to propose a new display panel and a new method of manufacturing the display panel to replace the oxide film TFT of the related art.

SUMMARY

The present disclosure proposes a display panel and a method of manufacturing the display panel. The display panel and the display panel are configured to solve problems of the related art such as an oxide film thin film transistor (TFT) of a complicated structure, too many manufacturing processes, and high production cost.

According to a first aspect of the present disclosure, a display panel includes a substrate, a source/drain layer disposed on the substrate, a light shielding layer disposed on the substrate and disposed in the same layer as the source/drain layer, a dielectric layer disposed on the substrate and covering the light shielding layer and the source/drain layer, and an oxide semiconductor layer disposed on the dielectric layer. A first hole and a second hole are disposed on the dielectric layer. The first hole and the second hole expose the source/drain layer and one side of the light shielding layer away from the substrate, respectively. The oxide semiconductor layer is connected to the source/drain layer and the light shielding layer through the first hole and the second hole, respectively.

According to one embodiment of the present disclosure, the display panel further comprises a gate insulating layer. The gate insulating layer is disposed on the oxide semiconductor layer.

According to one embodiment of the present disclosure, the gate line layer is disposed on the gate insulating layer. The gate line layer is a stacked structure of molybdenum and copper or a stacked structure of aluminum and molybdenum.

According to one embodiment of the present disclosure, the display panel further comprises a passivation layer disposed on the dielectric layer and covering the gate line layer, the gate insulating layer, and the oxide semiconductor layer. A third hole is disposed on the passivation layer. The third hole exposes a surface of one side of the oxide semiconductor layer away from the substrate.

According to one embodiment of the present disclosure, a pixel electrode is disposed on the passivation layer. The pixel electrode is connected to the oxide semiconductor layer through the second hole.

According to one embodiment of the present disclosure, the source/drain layer and the light shielding layer are both of a stacked structure of molybdenum and copper or of a stacked structure of aluminum and molybdenum.

According to one embodiment of the present disclosure, material for a dielectric layer comprises SiOx.

According to one embodiment of the present disclosure, material for the oxide semiconductor layer comprises indium gallium zinc oxide (IGZO), IGTO and IGZTO.

According to a second aspect of the present disclosure, a method of manufacturing a display panel includes: a step S10 of supplying a substrate; depositing a first metal layer on the substrate; patterning the first metal layer to form a source/drain layer and a light shielding layer; a step S20 of depositing a dielectric layer on the substrate, the source/drain layer, and the light shielding layer; etching the dielectric layer to form a first hole and a second hole; a step S30 of depositing an oxide semiconductor layer on the dielectric layer; patterning the oxide semiconductor layer; a step S40 of depositing a gate insulating layer and a gate line layer on the oxide semiconductor layer; a step S50 of: depositing a passivation layer on the gate insulating layer, the gate line layer, the oxide semiconductor layer, and the dielectric layer; etching the passivation layer to form a third hole; and a step S60 of forming a pixel electrode layer on the passivation layer.

According to one embodiment of the present disclosure, the first metal layer is of a stacked structure of molybdenum and copper or a stacked structure of aluminum and molybdenum.

An advantageous effect brought by the present disclosure is as follows. A source/drain layer and a light shielding layer are disposed on the same layer of the substrate. A first metal layer is etched to form the source/drain layer and the light shielding layer simultaneously. A dielectric layer is arranged on the substrate and covers the light shielding layer and the source/drain layer. So the dielectric layer functions as an isolating layer, which reduces the number of oxide TFT layers of the display panel, simplifying the film structure of the display panel, reducing the processes and masks required for production, thereby increasing production efficiency and reducing production costs.

BRIEF DESCRIPTION OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF THE EMBODIMENTS

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure.

Embodiment 1

A first embodiment of the present disclosure provides a display panel, which will be described in detail below with reference to FIG. 1 and FIG. 2.

Figure 1:
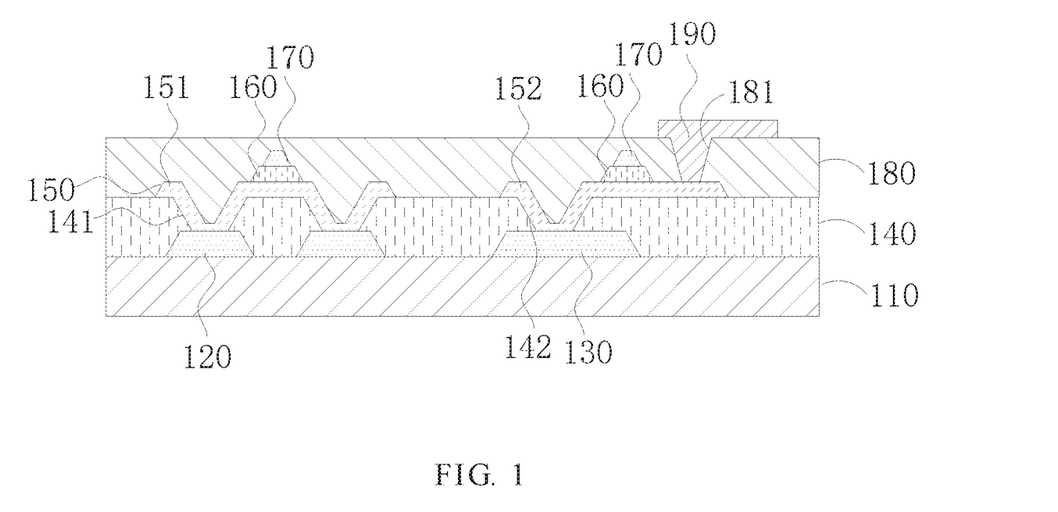
FIG. 1 is a schematic diagram of a display panel from a cross-sectional view according to the first embodiment of the disclosure.

FIG. 1 is a schematic diagram of a display panel 100 from a cross-sectional view according to the first embodiment of the disclosure. The display panel 100 includes a substrate 110, a source/drain layer 120, a light shielding layer 130, a dielectric layer 140, and an oxide semiconductor layer 150.

In the present embodiment, the source/drain layer 120 is disposed on the substrate 110. The light shielding layer 130 is disposed on the substrate 110. The light shielding layer 130 and the source/drain layer 120 is disposed on the same layer. The dielectric layer 140 is disposed on the substrate 110 and covers the light shielding layer 130 and the source/drain layer 120. The first hole 141 and the second hole 142 are disposed on the dielectric layer 140. The first hole 141 and the second hole 142 expose the source/drain layer 120 and one side of the light shielding layer 130 away from the substrate 110, respectively. The oxide semiconductor layer 150 is disposed on the dielectric layer 140. The oxide semiconductor layer 150 is connected to the source drain electrode 120 and the light shielding layer 130 through the first hole 141 and the second hole 142, respectively.

The dielectric layer 140 covers the source/drain layer 120 and the light shielding layer 130 such that the dielectric layer 140 simultaneously functions as an isolating layer, thereby simplifying the film layer structure of the display panel 100.

The oxide semiconductor layer 150 includes a first oxide semiconductor 151 and a second oxide semiconductor 152. The first oxide semiconductor 151 is connected to the source/drain layer 120 through the first hole 141. The second oxide semiconductor 152 is connected to the light shielding layer 130 through the second hole 142. The light shielding layer 130 with a function of light shielding serves as a source electrode of the driving TFT of the display panel 100. Therefore, the film structure of the display panel 100 is simplified.

The display panel 100 further includes a gate insulating layer 160 in the first embodiment. The gate insulating layer 160 is disposed on the oxide semiconductor layer 150.

Material for a gate insulating layer 160 is SiOx in another embodiment. Moreover, a gate insulating layer 160 is of a stacked structure of SiOx and SiNx in another embodiment.

The display panel 100 further includes a gate line layer 170 in the first embodiment. The gate line layer 170 is disposed on the gate insulating layer 160.

A gate line layer 170 may be of a stacked structure of molybdenum and copper in another embodiment. Besides, a gate line layer 170 is of a stacked structure of aluminum and molybdenum in another embodiment.

The display panel 100 further includes a passivation layer 180 in the first embodiment. The passivation layer 180 is disposed on the dielectric layer 140. The passivation layer 180 covers the gate line layer 170, the gate insulating layer 160, and the oxide semiconductor layer 150. A third hole 181 is disposed on the passivation layer 180. The third hole 181 exposes the surface of one side of the oxide semiconductor layer 150 away from the substrate 110.

In another embodiment, material for a passivation layer 180 is SiOx or SiNx. Besides, a passivation layer 180 is of a stacked structure of SiOx and SiNx in another embodiment.

A pixel electrode 190 is arranged on the passivation layer 180 in the present embodiment. The pixel electrode 190 is connected to the oxide semiconductor layer 150 through the third hole 181.

The pixel electrode 190 is connected to the second oxide semiconductor 152 through the third hole 181. The light shielding layer 130 further serves as a source electrode of the driving TFT in the display panel 100. Accordingly, the film structure of the display panel 100 is simplified.

In another embodiment, material for a source/drain layer 120 is the same as material for a light shielding layer 130. The structure of the source/drain layer 120 is the same as the structure of the light shielding layer 130 as well. In this way, the film structure of a display panel 100 is simplified. At the same time, the source/drain layer 120 and the light shielding layer 130 can be formed in one photolithography process, thereby reducing the production process.

The source/drain layer 120 and the light shielding layer 130 are both of a stacked structure of molybdenum and copper or of a stacked structure of aluminum and molybdenum.

In another embodiment, material for a dielectric layer 140 includes SiOx. In another embodiment, a dielectric layer 140 is of a stacked structure of SiOx and SiNx.

In another embodiment, material for an oxide semiconductor layer 150 includes indium gallium zinc oxide (IGZO), IGTO and IGZTO.

Figure 2:
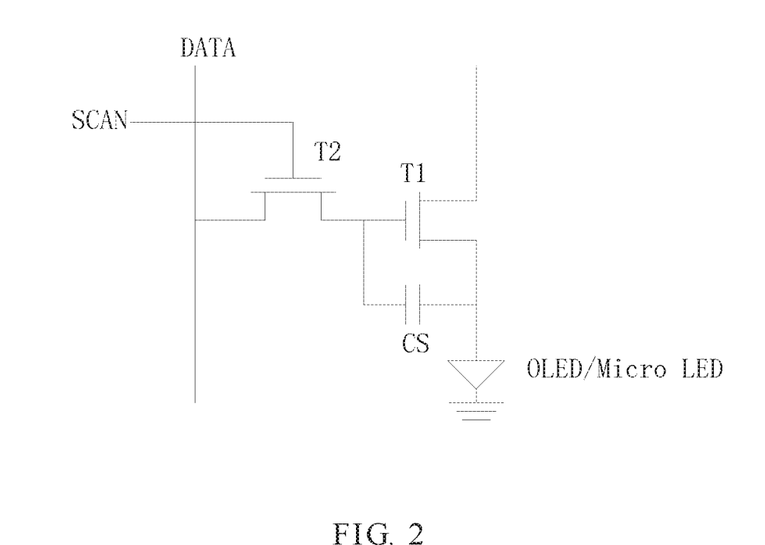
FIG. 2 illustrates a circuit diagram of a display panel according to the first embodiment of the disclosure.
Figure 3:
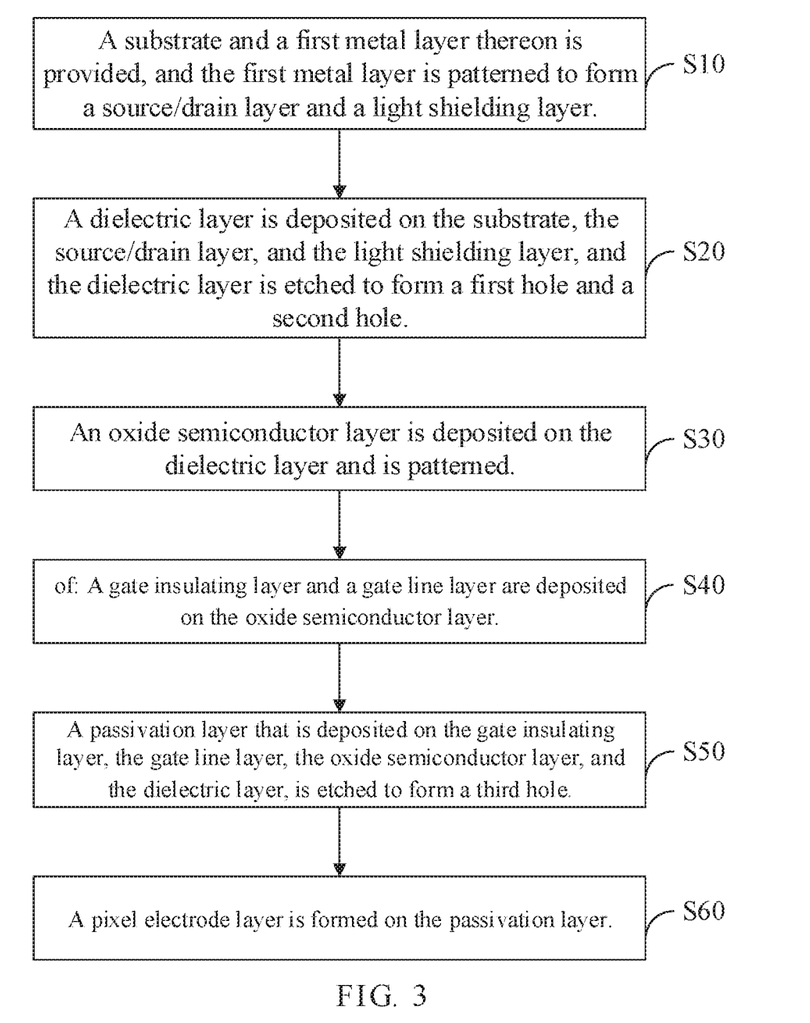
FIG. 3 illustrates a flowchart of a method of manufacturing a display panel according to a second embodiment of the disclosure.

FIG. 2 is a schematic diagram of a circuit structure of a display panel. T1 indicates a driving TFT. T2 indicates an address TFT. CS indicates a storage capacitor. The driving TFT T1 converts a voltage imposed on the gate into a current flowing through the driving TFT T1. The driving TFT T1 is in series with a driving current device; that is, the current following through the driving TFT T1 is the current that drives the current device. The gate voltage imposed on the driving TFT T1 is the data voltage from a DATA line. The address TFT T2 selectively connects a DATA signal to the gate of the driving TFT T1. As SCAN as a turn-on signal, the DATA signal enters the gate of the driving TFT T1. As SCAN as a turn-off signal, the gate voltage imposed on the driving TFT T1 is independent of the DATA signal.

The driving current device is an OLED in the present embodiment. A driving current device is a micro light emitting diode (LED) in another embodiment.

The source/drain layer 120 and the light shielding layer 130 are disposed in the same layer. The pixel electrode 190 is connected to the light shielding layer 130 through the second oxide semiconductor 152. In this way, the light shielding layer is simultaneously provided with light shielding and functions as a display panel 10, which drives the TFT source electrode. Besides, the dielectric layer 140 covers the source/drain layer 120 and the light shielding layer 130. In this way, the dielectric layer 140 serves as an isolating layer, thereby simplifying the film structure of the display panel 100.

Embodiment 2

A second embodiment of the present disclosure further proposes a method of manufacturing a display panel 200. The manufacturing method will be described in detail below with reference to FIG. 3 to FIG. 9. The manufacturing method includes a block S10, a block S20, a block S30, a block S40, a block S50, and a block S60.

Figure 4:
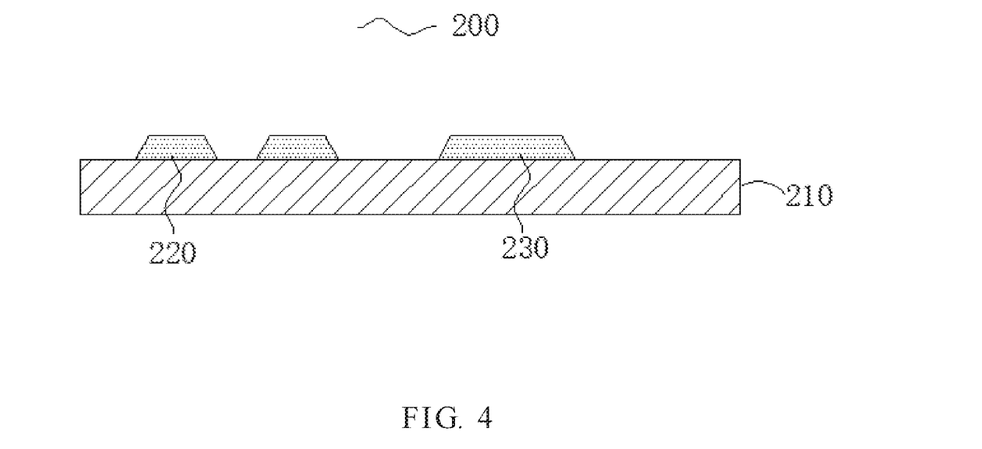
FIG. 4 illustrates a cross-sectional view of the display panel in the step S10 according to the second embodiment of the disclosure.

At block S10, as illustrated in FIG. 4, a substrate 210 is provided. A first metal layer is deposited on the substrate 210. The first metal layer is patterned to form a source/drain layer 220 and a light shielding layer 230.

The first metal layer is of a stacked structure of molybdenum and copper or a stacked structure of aluminum and molybdenum in the second embodiment.

Figure 5:
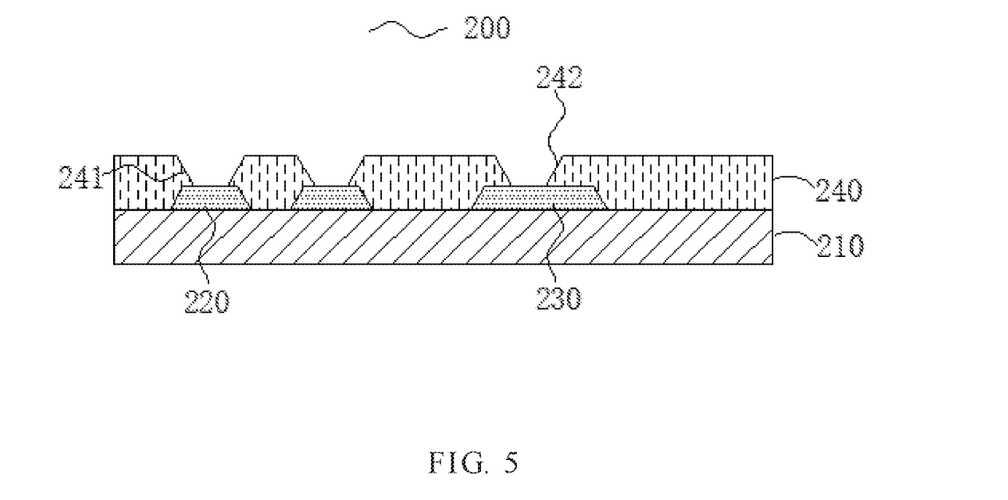
FIG. 5 illustrates a cross-sectional view of the display panel in the step S20 according to the second embodiment of the disclosure.

At block S20, as illustrated in FIG. 5, a dielectric layer 240 is deposited on the substrate 210, the source/drain layer 220, and the light shielding layer 230. The dielectric layer 240 is etched to form a first hole 241 and a second hole 242.

In another embodiment, material for a dielectric layer 240 includes SiOx. In another embodiment, a dielectric layer 240 is of a stacked structure of SiOx and SiNx.

Figure 6:
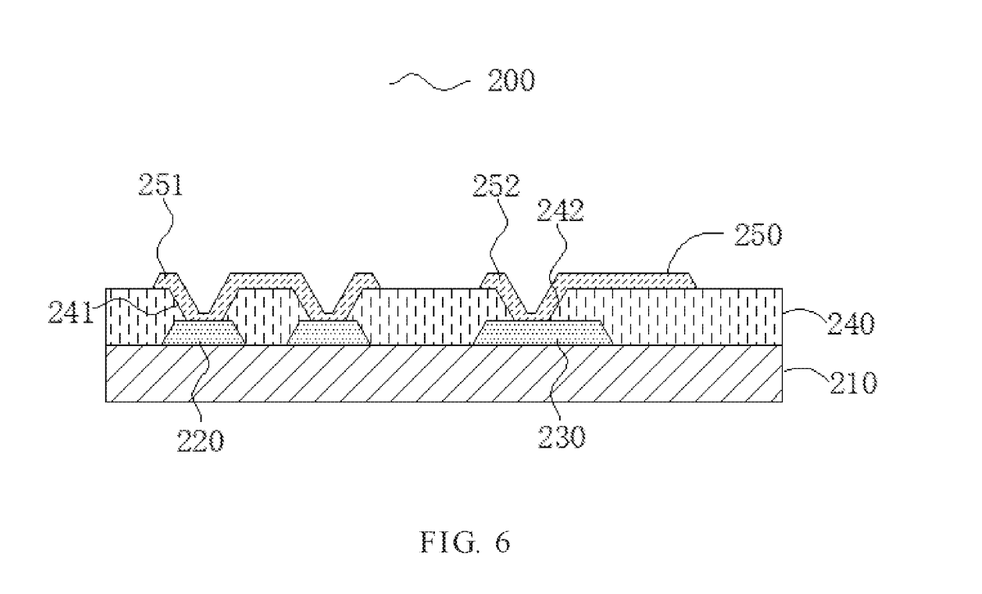
FIG. 6 illustrates a cross-sectional view of the display panel in the step S30 according to the second embodiment of the disclosure.

At block S30, as illustrated in FIG. 6, an oxide semiconductor layer 250 is deposited on the dielectric layer 240, and the oxide semiconductor layer 250 is patterned.

The material of the oxide semiconductor layer 250 is indium gallium zinc oxide (IGZO), IGTO, or IGZTO in the second embodiment. Specifically, the oxide semiconductor layer 250 is patterned to form the first oxide semiconductor 251 and the second oxide semiconductor 252 as illustrated in FIG. 6. The first oxide semiconductor 251 is connected to the source/drain layer 220 through the first hole 241. The second oxide semiconductor 252 is connected to the light shielding layer 230 through the second hole 242. In this way, the light shielding layer 230 serves as a source electrode for driving the TFT of the display panel 200 and has a function of light shielding, thereby simplifying the film structure of the display panel 200.

Figure 7:
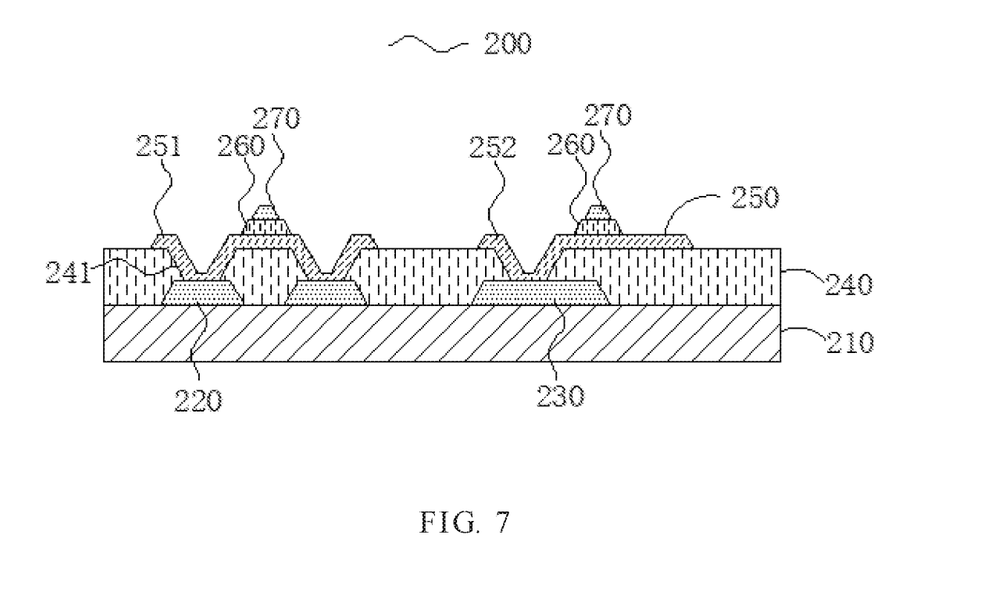
FIG. 7 illustrates a cross-sectional view of the display panel in the step S40 according to the second embodiment of the disclosure.

At block S40, as illustrated in FIG. 7, a gate insulating layer and a gate line layer are formed on the oxide semiconductor layer 250.

Material for a gate insulating layer 260 is SiOx in another embodiment. Moreover, a gate insulating layer 260 is of a stacked structure of SiOx and SiNx in another embodiment.

A gate line layer 270 is of a stacked structure of molybdenum and copper in another embodiment. Besides, a gate line layer 270 is of a stacked structure of aluminum and molybdenum in another embodiment.

Figure 8:
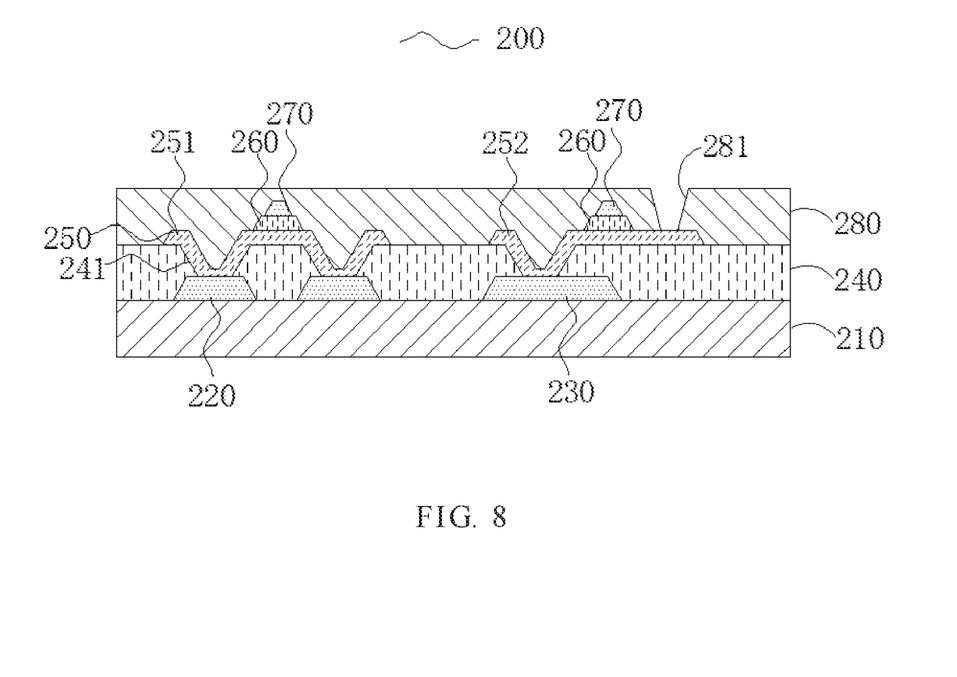
FIG. 8 illustrates a cross-sectional view of the display panel in the step S50 according to the second embodiment of the disclosure.

At block S50, as illustrated in FIG. 8, a passivation layer 280 is deposited on the gate insulating layer 260, the gate line layer 270, the oxide semiconductor layer 250, and the dielectric layer 240. The passivation layer 280 is etched to form a third hole 281. The third hole 281 exposes the surface of one side of the oxide semiconductor layer 250 away from the substrate 210.

Material for the passivation layer 280 is SiOx or SiNx. Besides, a passivation layer 280 is of a stacked structure of SiOx and SiNx in another embodiment.

Figure 9:
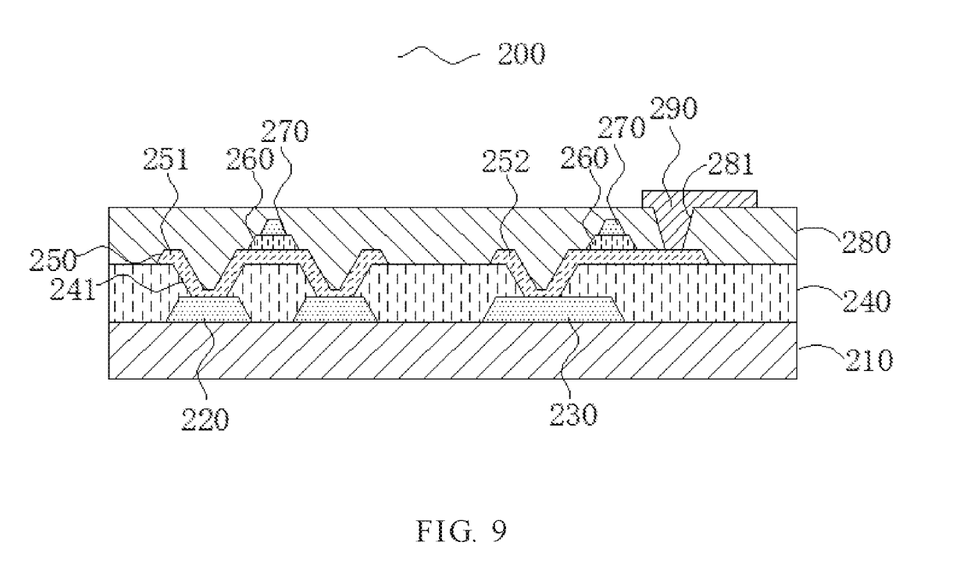
FIG. 9 illustrates a cross-sectional view of the display panel according to the second embodiment of the disclosure.

At block S60, as illustrated in FIG. 9, a pixel electrode layer 290 is deposited on the passivation layer 280. The pixel electrode layer 290 is connected to the second oxide semiconductor layer 250 through the third hole 281.

The pixel electrode 290 is connected to the second oxide semiconductor 252 through the third hole 281. In this way, the light shielding layer 230 serves as a source electrode of the display panel driving TFT, thereby simplifying the film structure of the display panel 200.

According to the present disclosure, a source/drain layer 220 and a light shielding layer 230 are disposed on the same layer of the substrate 210. A first metal layer is etched to form the source/drain layer 220 and the light shielding layer 230 simultaneously. A dielectric layer 240 is arranged on the substrate 210 and covers the light shielding layer 230 and the source/drain layer 220. So the dielectric layer 240 functions as an isolating layer, which reduces the number of oxide TFT layers of the display panel 200, simplifying the film structure of the display panel 200, reducing the processes and masks required for production, thereby increasing production efficiency and reducing production costs.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display panel, comprising:
   a substrate;
   a source/drain layer, having two source/drain regions disposed on the substrate;
   a light shielding layer, disposed on the substrate, and disposed outside the two source/drain regions in the same layer as the source/drain layer;
   a dielectric layer, disposed on the substrate and covering the light shielding layer and the source/drain layer; a first hole and a second hole being disposed on the dielectric layer; the first hole and the second hole exposing the source/drain layer and one side of the light shielding layer away from the substrate, respectively; and
   an oxide semiconductor layer, disposed on the dielectric layer; the oxide semiconductor layer being connected to the source/drain layer and the light shielding layer through the first hole and the second hole, respectively;
   wherein a pixel electrode is electrically connected to the light shielding layer.

2. The display panel according to claim 1, wherein the display panel further comprises a gate insulating layer; the gate insulating layer is disposed on the oxide semiconductor layer.

3. The display panel according to claim 2, wherein the gate line layer is disposed on the gate insulating layer; the gate line layer is a stacked structure of molybdenum and copper or a stacked structure of aluminum and molybdenum.

4. The display panel according to claim 3, wherein the display panel further comprises a passivation layer disposed on the dielectric layer and covering the gate line layer, the gate insulating layer, and the oxide semiconductor layer; a third hole is disposed on the passivation layer; the third hole exposes a surface of one side of the oxide semiconductor layer away from the substrate.

5. The display panel according to claim 4, wherein the pixel electrode is disposed on the passivation layer; the pixel electrode is connected to the oxide semiconductor layer through the third hole.

6. The display panel according to claim 1, wherein the source/drain layer and the light shielding layer are both of a stacked structure of molybdenum and copper or of a stacked structure of aluminum and molybdenum.

7. The display panel according to claim 3, wherein material for a dielectric layer comprises SiOx.

8. The display panel according to claim 3, wherein material for the oxide semiconductor layer comprises indium gallium zinc oxide (IGZO), IGTO and IGZTO.

9. A display panel, comprising:
   a substrate;
   a source/drain layer, having two source/drain regions disposed on the substrate;
   a light shielding layer, disposed on the substrate, and disposed outside the two source/drain regions in the same layer as the source/drain layer;
   a dielectric layer, disposed on the substrate and covering the light shielding layer and the source/drain layer; a first hole and a second hole being disposed on the dielectric layer; the first hole and the second hole exposing the source/drain layer and one side of the light shielding layer away from the substrate, respectively;
   an oxide semiconductor layer, disposed on the dielectric layer; the oxide semiconductor layer being connected to the source/drain layer and the light shielding layer through the first hole and the second hole, respectively; and
   a passivation layer disposed on the dielectric layer and covering the oxide semiconductor layer; a third hole is disposed on the passivation layer; the third hole exposes a surface of one side of the oxide semiconductor layer away from the substrate;
   wherein a pixel electrode is electrically connected to the light shielding layer.

10. The display panel according to claim 9, wherein the display panel further comprises a gate insulating layer and a gate line layer; the gate insulating layer is disposed on the oxide semiconductor layer, and the gate line layer is disposed on the gate insulating layer; the passivation layer is disposed on the gate line layer and the gate insulating layer.

11. The display panel according to claim 10, wherein the gate line layer is a stacked structure of molybdenum and copper or a stacked structure of aluminum and molybdenum.

12. The display panel according to claim 11, wherein the pixel electrode is disposed on the passivation layer; the pixel electrode is connected to the oxide semiconductor layer through the third hole.

13. The display panel according to claim 9, wherein the source/drain layer and the light shielding layer are both of a stacked structure of molybdenum and copper or of a stacked structure of aluminum and molybdenum.

14. The display panel according to claim 9, wherein material for a dielectric layer comprises SiOx.

15. The display panel according to claim 9, wherein material for the oxide semiconductor layer comprises indium gallium zinc oxide (IGZO), IGTO and IGZTO.

* * * * *